United States Patent

Chun

Patent Number: 5,304,949
Date of Patent: Apr. 19, 1994

[54] COMMON BASE AMPLIFIER

[75] Inventor: Christopher K. Y. Chun, Mesa, Ariz.

[73] Assignee: Motorola Inc., Schaumburg, Ill.

[21] Appl. No.: 989,671

[22] Filed: Dec. 14, 1992

[51] Int. Cl.[5] .............................................. H03F 3/08
[52] U.S. Cl. .................................... 330/296; 330/308
[58] Field of Search ............. 250/214 A; 330/59, 288, 330/296, 308, 110

[56] References Cited

U.S. PATENT DOCUMENTS

| | | | |
|---|---|---|---|
| 2,647,957 | 8/1953 | Mallinckrodt | 330/296 |
| 4,420,724 | 12/1983 | Owen | 330/308 X |
| 5,012,202 | 4/1991 | Taylor | 330/308 X |
| 5,216,386 | 6/1993 | Wyatt | 330/308 |

Primary Examiner—Steven Mottola
Attorney, Agent, or Firm—Christopher Chun

[57] ABSTRACT

A common base amplifier (29) has an input (31) and an output (32). A transistor (33) has an emitter coupled to the input (31) of the amplifier (29), a collector coupled to the output (32) of the amplifier (29), and a base coupled to a voltage reference (34) provides low input impedance and unity current gain. A control circuit (38) controls a first bias circuit (36) and a second bias circuit (37). The second bias circuit (37) is coupled to the collector of the transistor (33) and provides a bias current for the transistor (33) while transistor (33) outputs the bias current which is received by the first bias circuit (36). Control circuit (38) determines the current magnitude for both the first bias circuit (36) and the second bias circuit (37) and ensures that the current magnitudes are maintained at a fixed ratio.

15 Claims, 1 Drawing Sheet ically generated current signal in accordance
with the present invention.

COMMON BASE AMPLIFIER

BACKGROUND OF THE INVENTION

This invention relates, in general, to amplifiers, and more particularly to common base amplifiers.

A common base amplifier configuration is well known by those skilled in the art and has properties which make it very attractive for use as a buffer. The key properties are wide bandwidth and low input impedance. The low input impedance of the common base configuration allows it to be coupled to a large parasitic capacitance without forming a bandwidth limiting pole. Furthermore, the wide bandwidth of the common base amplifier allows it to be used in conjunction with other amplification stages with minimal impact to the subsequent amplifier stages. Generally, a common base stage provides a unity gain current signal from input to output thereby isolating a circuit coupled to the output from any input loading capacitance. Two problems which limit common base applications on an integrated circuit are 1) circuit complexity and 2) circuit density.

An example of a highly capacitive node is an input-/output (I/O) of an integrated circuit. The high capacitance of an I/O can be the single most important factor in determining system speed of an integrated circuit. For example, optical signals have extremely fast transmission speeds. An optical signal coupled to an integrated circuit is converted to an electrical signal. The optical signal converted to an electrical signal typically has a small magnitude and must be amplified to logic levels used internally on the integrated circuit. Parasitic capacitance at the I/O form a dominant pole when coupled to an amplifier with a relatively high input impedance thereby limiting speed at which data can be transmitted to the input. This problem is compounded by the fact that hundreds of I/O's might be needed on the integrated circuit. I/O circuits are placed in close proximity to the I/O pad. Area for an I/O circuit is at a premium and any solution that addresses the speed problem must also be area efficient (to fit within an I/O site).

It would be of great benefit if a common base stage is provided which is extremely simple, occupies a small physical area, and has a wide bandwidth.

SUMMARY OF THE INVENTION

Briefly stated, there is provided an amplifier of increased bandwidth responsive to an optically generated signal. A transimpedance amplification stage provides voltage gain and has an input and an output coupled to an output of the amplifier. A common base stage buffers the input of the transimpedance amplification stage from capacitive loading. The common base stage has an input coupled to an input of the amplifier and an output coupled to the input of the transimpedance amplification stage.

DETAILED DESCRIPTION OF THE DRAWINGS

Figure 1:
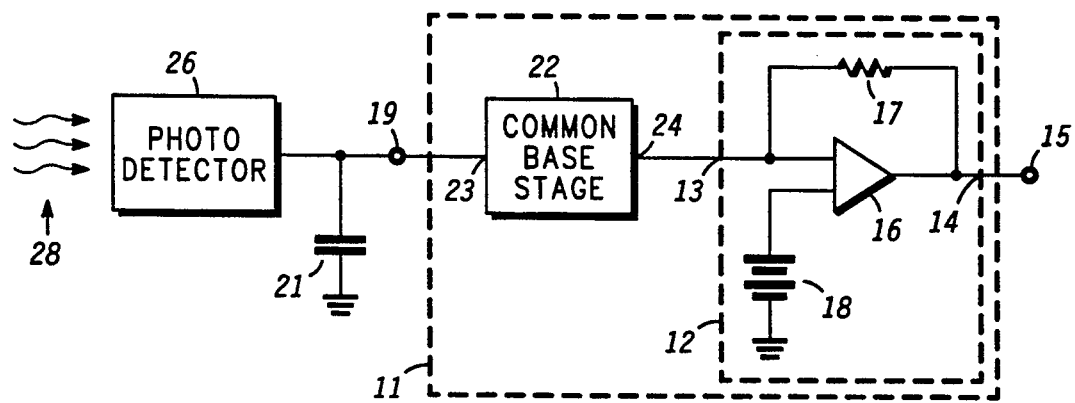
FIG. 1 is a block diagram an amplifier responsive to an optically generated current.

FIG. 1 is a block diagram of an amplifier responsive to an optically generated current signal in accordance with the present invention.

A transimpedance amplifier is well known by those skilled in the art. The transimpedance amplifier is also known as a shunt feedback amplifier. Basically, the transimpedance amplifier converts an input current signal to an output voltage signal. A simplified representation of the transimpedance amplifier is an amplifier having a feedback resistor Rf (negative feedback) coupled from amplifier input to output. Assuming the amplifier has a large gain, an input current "I" will yield an output voltage signal which is approximated by the equation Vout=Rf * I. An example of a common usage of a transimpedance amplifier is in an input stage of an optically coupled integrated circuit. An integrated circuit receiving an optical signal converts the optical signal to a form used internal to the integrated circuit. This is generally achieved using a photodiode. The photodiode is responsive to the optical signal and generates a small (nanoampere to microampere) current signal which is converted from a current signal to a voltage signal by the transimpedance amplifier.

Problems occur with this configuration due to parasitic capacitance at the integrated circuit input. The parasitic capacitance comprises a number of capacitance's such as pad capacitance, wire capacitance, package capacitance, lead capacitance, and photo detector depletion capacitance. The parasitic capacitance forms a pole with the input impedance of the transimpedance amplifier which limits performance. The input impedance of the transimpedance amplifier is approximately the feedback resistance divided by the amplifier gain. Reducing amplifier gain by reducing the feedback resistance can extend the pole to higher frequencies but additional gain stages may have to be used to generate the signal levels needed. Reducing the feedback resistance will increase input noise. The additional gain stages will consume more area, dissipate more power, add noise, and increase delay.

An amplifier 11 is shown in FIG. 1 which reduces or eliminates these problems. Amplifier 11 has an input 19 and an output 15. A transimpedance amplification stage 12 has an input 13 and an output 14. In this embodiment, transimpedance amplification stage 12 comprises an amplifier 16 and a feedback resistor 17. Amplifier 16 has a first input coupled to input 13, a second input, and an output coupled to output 14. The second input of amplifier 16 is coupled to a voltage reference 18 which sets the quiescent operating voltage at the output of amplifier 16. Feedback resistor 17 which sets the voltage gain of amplification stage 12 has a first terminal coupled to the first input of amplifier 16 and a second terminal coupled to the output of amplifier 16. Output 14 is coupled to output 15 of amplifier 11.

A common base stage 22 is used to decouple input 13 of transimpedance amplification stage 12 from a parasitic capacitive load 21. Common base stage 22 has an input 23 coupled to input 19 of amplifier 11 and an output 24 coupled to input 13 of transimpedance amplification stage 12. In the preferred embodiment, common base stage 22 has a wider bandwidth than transimpedance amplification stage 12 to ensure that common base stage 22 is not the main factor in limiting amplifier 11 performance. An optically generated current or input current signal is provided by a photo detector 26. Light indicated by arrows 28 impinges photo detector 26 generating the input current signal. The input current signal varies as a function of light intensity. In the preferred embodiment, common base stage 22 provides a current (substantially equal to the input current signal generated by photodiode 26) to input 13 of transimpedance amplification stage 12. A current signal produced at the output of common base stage 22 is converted to a voltage signal (at output 14) by transimpedance amplification stage 12.

The input impedance of transimpedance amplification stage 12 is approximately the magnitude of resistor 17 divided by amplifier 16 voltage gain. Common base stage 22 must have an input impedance equal to or less than the input impedance of amplification stage 12 to provide any significant benefit in increasing amplifier 11 bandwidth. In the preferred embodiment, common base stage 22 has an input impedance significantly lower than the input impedance of amplification stage 12. The input impedance of common base stage 22 is such that when combined with parasitic capacitance 21 a pole is formed at a frequency significantly higher than would be formed if input 13 of transimpedance amplification stage 12 was coupled directly to input 19. A secondary factor is that parasitic capacitance at output 24 is less than parasitic capacitance 21. The combination of common base stage 22 and transimpedance amplification stage 12 increases amplifier 11 speed and bandwidth while functioning similarly to a transimpedance amplifier.

Another benefit of using common base stage 22 is low noise. Noise (or signal to noise ratio) can be a critical factor when dealing with signals having small current or voltage magnitudes. The dominant noise introduced by common base stage 22 is shot noise. Shot noise is a function of common base stage 22 bias current. Shot noise and bandwidth increases with bias current magnitude. For applications where noise is critical, amplifier 11 can reduce noise by decreasing the bias current of common base stage 22 at the expense of bandwidth.

Figure 2:
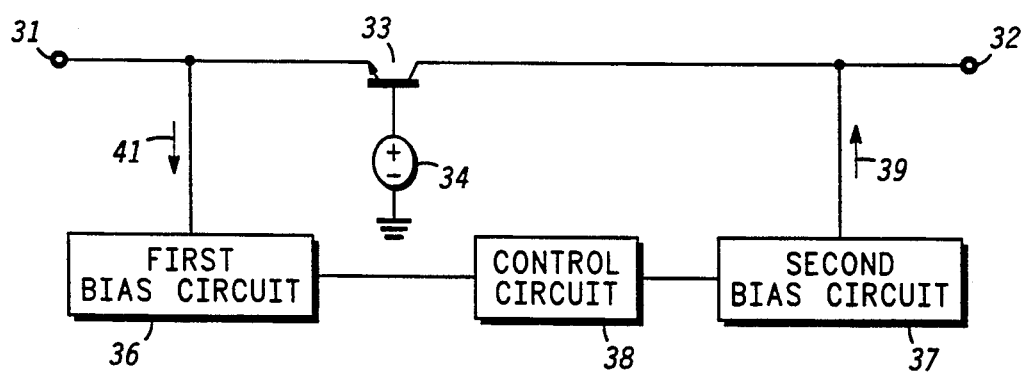
FIG. 2 is a block diagram of a common base amplifier in accordance with the present invention.

FIG. 2 is a block diagram of a common base amplifier in accordance with the present invention.

Common base amplifier 29 has an input 31 and an output 32. A transistor 33 provides a low input impedance at input 31 and approximately unity current gain. In the preferred embodiment, transistor 33 has a base, a collector coupled to output 32 and an emitter coupled to input 31. The base of transistor 33 is coupled to a voltage reference 34. A quiescent or static voltage at input 31 is determined by voltage reference 34. The voltage at input 31 under quiescent conditions (no input signal) is the voltage output by voltage reference 34 minus the base to emitter voltage of transistor 33. The quiescent voltage at input 31 can be adjusted to a positive, negative, or ground potential according to the application needs.

Biasing common base amplifier 29 is accomplished via a first bias circuit 36, a second bias circuit 37, and a control circuit 38. Second bias circuit 37 sources a current indicated by arrow 39 which is received by the collector of transistor 33. First bias circuit 36 sinks a current indicated by arrow 41 that is sourced by the emitter of transistor 33. First bias circuit 36 and second bias circuit 37 are integrally linked by control circuit 38. Control circuit 38 determines the current magnitude of both bias circuits 36 and 37 by providing a bias voltage at a first control output and a second control output.

First bias circuit 36 has a terminal coupled to the emitter of transistor 33 and an input coupled to the first control output of control circuit 38. Second bias circuit 37 has a terminal coupled to the collector of transistor 33 and an input coupled to the second control output of control circuit 38. In the preferred embodiment, the source current indicated by arrow 39 is substantially equal in magnitude to the sink current indicated by arrow 41. Control circuit 38 also ensures that any variation in current magnitude due to temperature, voltage, or other factors is identically transferred to both first bias circuit 36 and second bias circuit 37 thus maintaining substantially equal current magnitudes over varying operating conditions.

Operation of common base amplifier 29 is best explained through an example. Common base amplifier 29 is configured for unity current gain. If transistor 33 has a high beta or current gain, the collector current ($I_c$) is substantially similar to the emitter current ($I_e$). For this example, assume $I_c = I_e$. Under static operating conditions a first bias current ($I_{b1}$) provided by first bias circuit 36 equals $I_e$ and a second bias current ($I_{b2}$) provided by second bias circuit 37 equals $I_c$. It can also be inferred from the equation above that $I_{b1}$ equals $I_{b2}$.

This relationship changes when an input current signal ($I_{in}$) is coupled to input 31. The input current signal changes $I_e$ by adding or subtracting with bias current $I_{b1}$. In the preferred embodiment, $I_{in}$ magnitude is significantly less than $I_{b1}$ magnitude. A first equation listed below, illustrates the emitter current of transistor 33 when the input current signal is coupled to input 31 of common base amplifier 29.

$$I_e = I_{b1} + I_{in} \tag{1}$$

Since $I_e = I_c$, the collector current of transistor 33 is defined by a second equation.

$$I_c = I_{b1} + I_{in} \tag{2}$$

Since $I_{b1} = I_{b2}$ the collector current of transistor 33 can be alternately defined by a third equation.

$$I_c = I_{b2} + I_{in} \tag{3}$$

An output current ($I_{out}$) which can be positive or negative at output 32 of common base amplifier 29 is the difference between $I_c$ and $I_{b2}$. A fourth equation defines $I_{out}$.

$$I_{out} = (I_{b2} + I_{in}) - I_{b2} = I_{in} \tag{4}$$

Thus, any change in current at input 31 generates a corresponding change in current at output 32 (unity current gain). Transistor 33 operates at its maximum bandwidth in this configuration. Input impedance at input 31 is approximately the emitter resistance of transistor 33. The emitter resistance is a function of transistor 33 device geometry and bias current. In the preferred embodiment, the input impedance at input 31 is modified by adjusting device geometry or bias current to ensure a pole formed with any capacitance at input 31 does not form a pole which limits the performance of further circuit stages coupled to output 32 of common base amplifier 29 as described in FIG. 1. Common base stage 29 is ideal for isolating a large capacitance from other circuitry (such as a transimpedance amplifier) while maintaining wide bandwidth. Also, it should be obvious to those skilled in the art that a complementary version of common base amplifier 29 could be implemented.

Figure 3:
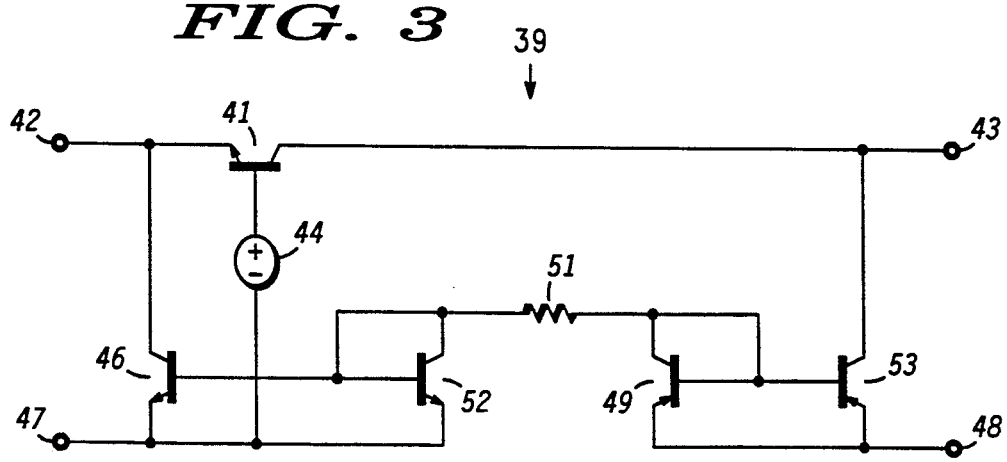
FIG. 3 is a schematic diagram of the preferred embodiment of a common base amplifier in accordance with the present invention.

FIG. 3 is a schematic diagram of the preferred embodiment of a common base amplifier in accordance with the present invention.

A common base amplifier 39 is a wide bandwidth, low input impedance amplifier having unity current gain. The low input impedance allows common base amplifier 39 to be coupled to a large input capacitance without forming a pole which severely degrades performance. Inputs to an integrated circuit to which the input of common base amplifier 39 may be coupled to, for example, are one such area that typically has a large parasitic capacitance associated with it. Package, wire, pad, and input protection circuits are just a few of the elements which add capacitance to an input. A circuit which can buffer circuitry internal to the integrated circuit from this capacitance must meet two criteria. First, the circuit must not limit performance. In other words, it must not reduce system bandwidth or add significant delay. Second, it must be simple, reliable, and fit within a small area. Complex circuits can have extremely large numbers of inputs/outputs (I/O) which typically are placed around the perimeter of the integrated circuit. Any input circuitry must fit within this small area by the input pad placing a premium on circuit size.

Common base amplifier 39 shown in FIG. 3 meets both criteria. Transistors 46, 52, 49, and 53 in FIG. 3 have a control electrode, a first conductive electrode, and a second conductive electrode corresponding to a base, collector, and emitter. Transistor 41 is an npn transistor having a base, an emitter coupled to an input 42, and a collector coupled to output 43. Transistor 41 is the "common base transistor" which forms the basis of common base amplifier 39. In the preferred embodiment, transistor 41 is chosen as an npn transistor because an npn transistor on a standard integrated process flow typically has a wider bandwidth than a pnp transistor. A "pnp" version which is the complement of common base amplifier 39 could also be fabricated.

A voltage reference 44 is coupled to the base of transistor 41 for setting the static voltage at input 42. Voltage reference 44 can range from a simple resistor divider to a voltage regulator circuit. In the preferred embodiment, voltage reference 44 provides a low impedance path to AC ground to keep input impedance at a minimum. The static voltage magnitude at input 42 is the voltage at the base of transistor 41 minus the base-emitter voltage. The static voltage magnitude is chosen for the specific application in which common base amplifier 39 is used.

Npn transistor 46 has a base, a collector coupled to the emitter of transistor 41, and an emitter coupled to a first power supply conductor 47. In the preferred embodiment, first power supply conductor 47 is coupled to a negative voltage power supply or ground. Transistor 46 is an embodiment of first bias circuit 36 of FIG. 2. A collector current of transistor 46 biases transistor 41.

A pnp transistor 49, a resistor 51, and a npn transistor 52 are coupled to form an embodiment of control circuit 38 of FIG. 2. Transistor 49 has a base coupled to a collector and an emitter coupled to a second power supply conductor 48. In the preferred embodiment, second power supply conductor 48 is coupled to a positive voltage power supply. Resistor 51 has a first terminal coupled to the collector of transistor 49 and a second terminal. Transistor 52 has a base coupled to a collector and an emitter coupled to first power supply conductor 47. The base and collector of transistor 52 is coupled to the base of transistor 46 and the second terminal of resistor 51. Transistors 49 and 52 are in a diode like configuration. Diodes could be used in place of transistors 49 and 52 but better area matching is achieved between transistors 46 and 52, and transistors 59 and 53 if similar structures are used. The magnitude of resistor 51 determines the current through transistors 49 and 52.

A pnp transistor 53 has a base coupled to the base and collector of transistor 49, a collector coupled to the collector of transistor 41, and an emitter coupled to second power supply conductor 48. Transistor 53 is an embodiment of second bias circuit 37 of FIG. 2. A collector current of transistor 53 biases transistor 41.

Static operation of common base amplifier 39 is set up by transistors 49 and 52, and resistor 51. As mentioned previously, the bias current magnitude through these devices is determined by resistor 51. Transistors 52 and 49 provide base-emitter junction bias voltages for transistors 46 and 53 respectively. Transistor area ratio between transistors 46 and 52, and transistors 49 and 53 determines current magnitude at the collectors of transistors 46 and 53. In the preferred embodiment, the collector current magnitude of transistors 46 and 53 are substantially equal thus the area ratio between transistors 46 and 52 is equal to the area ratio between transistors 53 and 49. Assuming transistor 41 has a high current gain or transistor beta, the emitter current of transistor 41 will be substantially equal to the collector current of transistor 41. Thus, transistor 53 sources a current which is received by the collector of transistor 41 and transistor 41 outputs an emitter current which is received by the collector of transistor 46. The key to static operation of common base amplifier 39 is in maintaining equal collector currents from transistors 46 and 53. Transistors 49 and 52, and resistor 51 which form control circuit 38 (FIG. 2) ensure this relationship by generating base-emitter bias voltages with the same current. Any changes in current magnitude through transistors 49 and 52 are equally transferred to transistors 53 and 46 thereby maintaining equal collector currents.

Common base amplifier 39 provides unity current gain similar to the operation of common base amplifier 29 described in FIG. 2. In the preferred embodiment, a current signal coupled to input 42 is substantially less than the static bias current flowing through transistor 41. As described in FIG. 2 a positive current change coupled to input 42 generates a substantially equal positive current change at output 43. Likewise, a negative current change at input 42 generates a substantially equal current change at output 43. An input impedance of common base amplifier 39 is dominated by the forward biased base-emitter junction of transistor 41. The input impedance is a function of bias current and transistor area of transistor 41. In the preferred embodiment, voltage reference 44 provides a low impedance path to AC ground to ensure the input impedance will be low. The simplicity of common base stage 39 and the relatively small number of components used in its formation allows it to be fabricated in a small area. Common base stage 39 is ideal for use as a wide bandwidth buffer since it can be placed in the normally restrictive confines of an input/output site.

By now it should be appreciated that a common base amplifier 39 has been provided. Common base amplifier 39 has low input impedance, wide bandwidth, low noise, and can be fabricated in a small area. Common base amplifier 39 provides unity current gain and has a biasing scheme which tracks over wide variations in operating conditions.

I claim:

1. An amplifier of increased bandwidth having an input and an output, the amplifier being responsive to an optically generated current signal applied to the input and for providing a voltage signal at the output comprising:
   a transimpedance amplifier stage, said transimpedance amplifier stage having an input and an output coupled to the output of the amplifier; and
   a common base stage for buffering said transimpedance amplifier from capacitance coupled to the input of the amplifier, said common base stage having an input coupled to the input of the amplifier and an output coupled to said input of said transimpedance amplification stage.

2. An amplifier responsive to an optically generated current signal and providing a voltage signal comprising:
   a transimpedance amplifier stage having an input and an output, said output being coupled to an output of the amplifier;
   a common base stage having an input coupled to an input of the amplifier and an output coupled to said input of said transimpedance amplification stage, said common base stage including:
   a first transistor having a base coupled to a reference voltage, a collector coupled to said output of said common base stage, and an emitter coupled to said input of said common base stage;
   a control circuit for maintaining a constant ratio between a first and a second bias current, said control circuit providing a bias voltage at both a first control output and a second control output;
   a first bias circuit providing said first bias current, said first bias circuit having a terminal coupled to said emitter of said first transistor and an input coupled to said first control output of said control circuit; and
   a second bias circuit providing said second bias current, said second bias circuit having a terminal coupled to said collector of said first transistor and an input coupled to said second control output of said control circuit.

3. The amplifier of claim 2 wherein said control circuit comprises:
   a second transistor, said second transistor having a control electrode and a first electrode coupled to said first control output of said control circuit and a second electrode coupled to a first power supply conductor;
   a resistor having a first terminal and a second terminal, said first terminal being coupled to said control electrode and said first electrode of said second transistor; and
   a third transistor, said third transistor having a control electrode and a first electrode coupled together and a second electrode coupled to a second power supply conductor, said control electrode and said first electrode being coupled to said second control output of said control circuit and said second terminal of said resistor.

4. The amplifier of claim 3 wherein said first bias circuit comprises a fourth transistor having a control electrode coupled to said first control output of said control circuit, a first electrode coupled to said emitter of said first transistor, and a second control electrode coupled to said first power supply conductor.

5. The amplifier of claim 4 wherein said second bias circuit comprises a fifth transistor having a control electrode coupled to said second control output of said control circuit, a first electrode coupled to said collector of said first transistor, and a second electrode coupled to said second power supply conductor.

6. The amplifier of claim 2 wherein the magnitude of said first and second bias currents are substantially equal.

7. The amplifier of claim 2 wherein said common base stage has a wider bandwidth than said transimpedance amplifier stage.

8. A buffer circuit having an input and an output comprising:
   a first transistor of a first conductivity type having a control electrode coupled for receiving a reference voltage, a first electrode coupled to the output of the buffer circuit, and a second electrode coupled to the input of the buffer circuit;
   a second transistor of a second conductivity type for providing a first bias voltage having a control electrode and first electrode coupled in common, and a second electrode coupled for receiving a first supply voltage;
   a third transistor of said first conductivity type for providing a second bias voltage having a control electrode and first electrode coupled to said control electrode of said second transistor, and a second electrode coupled for receiving a second supply voltage;
   a first bias circuit for providing a first bias current to said first electrode of said first transistor, said first bias circuit being responsive to said first bias voltage; and
   a second bias circuit for providing a second bias current to said second electrode of said first transistor, said second bias circuit being responsive to said second bias voltage.

9. A buffer circuit comprising:
   a transistor having a base coupled to a reference voltage, a collector coupled to an output of the buffer circuit, and an emitter coupled to an input of the buffer circuit;
   a control circuit for maintaining a constant ratio between a first and a second bias current, said control circuit providing a bias voltage at a first control output and a second control output, said control circuit including a transistor having a base coupled to a reference voltage, a collector coupled to an output of the buffer circuit, and an emitter coupled to an input of the buffer circuit, a control circuit for maintaining a constant ratio between a first and second bias current, said control circuit providing a bias voltage at a first control output and a second control output, said control circuit including, a first bias circuit providing said first bias current, said first bias circuit having a terminal coupled to said emitter of said transistor and an input coupled to said first control output of said control circuit, and a second bias circuit providing said second bias current, said second bias circuit having a terminal coupled to said collector of said transistor and an input coupled to said second control output of said control circuit;

a first bias circuit providing said first bias current, said first bias circuit having a terminal coupled to said emitter of said transistor and an input coupled to said first control output of said control circuit; and a second bias circuit providing said second bias current, said second bias circuit having a terminal coupled to said collector of said transistor and an input coupled to said second control output of said control circuit.

10. The buffer circuit of claim 9 wherein said first bias circuit comprises a transistor having a control electrode coupled to said first control output of said control circuit, a first electrode coupled to said emitter of said transistor of the buffer circuit, and a second control electrode coupled to said first power supply conductor.

11. The buffer circuit of claim 10 wherein said second bias circuit comprises a fifth transistor having a control electrode coupled to said second control output of said control circuit, a first electrode coupled to said collector of said transistor of the buffer circuit, and a second electrode coupled to said second power supply conductor.

12. The buffer circuit of claim 8 wherein said first and second bias currents are substantially equal and wherein a resistor couples between said first electrodes of said second and third transistors.

13. The buffer circuit of claim 8 including a circuit for providing said reference voltage at said base of said transistor, said circuit having a low impedance AC path to AC ground.

14. A common base amplifier circuit having an input and an output comprising:

a first transistor having a base coupled to a reference voltage, a collector coupled to the output of the common base amplifier circuit, and an emitter coupled to the input of the common base amplifier circuit;

a second transistor, said second transistor having a control electrode and a first electrode coupled together and a second electrode coupled to a first power supply conductor;

a resistor having a first terminal and a second terminal, said first terminal being coupled to said control electrode and said first electrode of said second transistor;

a third transistor, said third transistor having a control electrode and a first electrode coupled together and a second electrode coupled to a second power supply conductor, said control electrode and said first electrode being coupled to said second terminal of said resistor;

a fourth transistor having a control electrode coupled to said control electrode of said second transistor, a first electrode coupled to said emitter of said first transistor, and a second electrode coupled to said first power supply conductor; and a fifth transistor having a control electrode coupled to said control electrode of said third transistor, a first electrode coupled to said collector of said first transistor, and a second electrode coupled to said second power supply conductor.

15. The common base amplifier circuit of claim 14 wherein a collector current magnitude of said fourth transistor is substantially equal to a collector current magnitude of said fifth transistor.

* * * * *